United States Patent [19]
Tripathy et al.

[11] Patent Number: 5,532,320
[45] Date of Patent: Jul. 2, 1996

[54] SECOND ORDER NONLINEAR OPTICAL INTERPENETRATING POLYMER NETWORKS

[75] Inventors: Sukant K. Tripathy, Acton, Mass.; Ru-Jong Jeng, Hsinchu, Taiwan; Jayant Kumar, Lowell, Mass.; Sutiyao Marturunkakul; Jeng-I Chen, both of Tyngsboro, Mass.

[73] Assignee: University of Massachusetts Lowell, Lowell, Mass.

[21] Appl. No.: 361,278

[22] Filed: Dec. 21, 1994

Related U.S. Application Data

[63] Continuation of Ser. No. 159,679, Nov. 30, 1993, abandoned, which is a continuation-in-part of Ser. No. 881,609, May 12, 1992, Pat. No. 5,290,824, which is a division of Ser. No. 573,253, Aug. 24, 1990, Pat. No. 5,112,881.

[51] Int. Cl.$^6$ .................... C08L 63/00; C08L 83/08; C08F 20/34
[52] U.S. Cl. .................... 525/100; 525/102; 525/103; 525/391; 525/474; 525/476; 525/479; 525/903; 528/25; 528/28; 528/43
[58] Field of Search .................... 522/34, 49, 63, 522/75, 62, 65, 117, 904; 525/293, 903, 100, 102, 103, 391, 396, 474, 476, 479, 523; 528/124, 125, 25, 27, 28, 43

[56] References Cited

U.S. PATENT DOCUMENTS

| | | | |
|---|---|---|---|
| 5,037,935 | 8/1991 | Gulotty et al. | 528/125 |
| 5,257,127 | 10/1993 | Hikmet | 359/328 |
| 5,288,816 | 2/1994 | Inbasekaran et al. | 525/502 |
| 5,290,630 | 3/1994 | Devonald et al. | 428/333 |

FOREIGN PATENT DOCUMENTS

| | | |
|---|---|---|
| 313475 | 4/1989 | European Pat. Off. |
| 313476 | 4/1989 | European Pat. Off. |
| 321891 | 6/1989 | European Pat. Off. |

OTHER PUBLICATIONS

Eich et al., "Novel Second-Order Nonlinear Optical Polymers Via Chemical Cross-Linking-Induced Vitrification Under Electric Field," *J. Appl. Phys.*, 66(7):3241–3247 (1989).

Reck et al., "Crosslinked Epoxy Polymers With Large and Stable Nonlinear Optical Susceptibilities," Abstract, *SPIE Nonlinear Optical Properties of Organic Materials II*, 1147:74–83, (1989).

Singer et al., "Electro-Optic Phase Modulation and Optical Second-Harmonic Generation In Corona-Poled Polymer Films," *Appl. Phys. Lett.*, 53(19):1800–1802, (1988).

Mortazavi et al., "Second-Harmonic Generation and Absorption Studies of Polymer-Dye Films Oriented by Corona-Onset Poling at Elevated Temperatures," *J. Opt. Soc. Am. B*, 6(4):733–741, (1989).

*Primary Examiner*—Susan W. Berman
*Attorney, Agent, or Firm*—Hamilton, Brook, Smith & Reynolds

[57] ABSTRACT

A nonlinear optical interpenetrating polymer network which can exhibit nonlinear optical properties includes a first polymer, and a second polymer interpenetrating the first polymer. At least one of the polymers includes a nonlinear optical component. A method of forming a nonlinear optical interpenetrating polymer network which can exhibit nonlinear optical properties includes combining a first prepolymer, which can react to form a first polymer, with at least one monomer which can react to form a second polymer. At least one of either the first prepolymer or the monomer include a nonlinear optical component. The nonlinear optical component is poled and the first prepolymer and the monomer, or monomers, of the second prepolymer are reacted while the nonlinear optical component is being poled. The reaction of the first prepolymer forms a first polymer network and reaction of the monomer(s) form a second polymer network which interpenetrates the first polymer network to form an interpenetrating polymer network. The interpenetrating polymer network fixes the nonlinear optical component in the poled position, thereby forming an interpenetrating polymer network which exhibits nonlinear optical properties.

25 Claims, 4 Drawing Sheets

BPAZO

ASD

FIG. 1
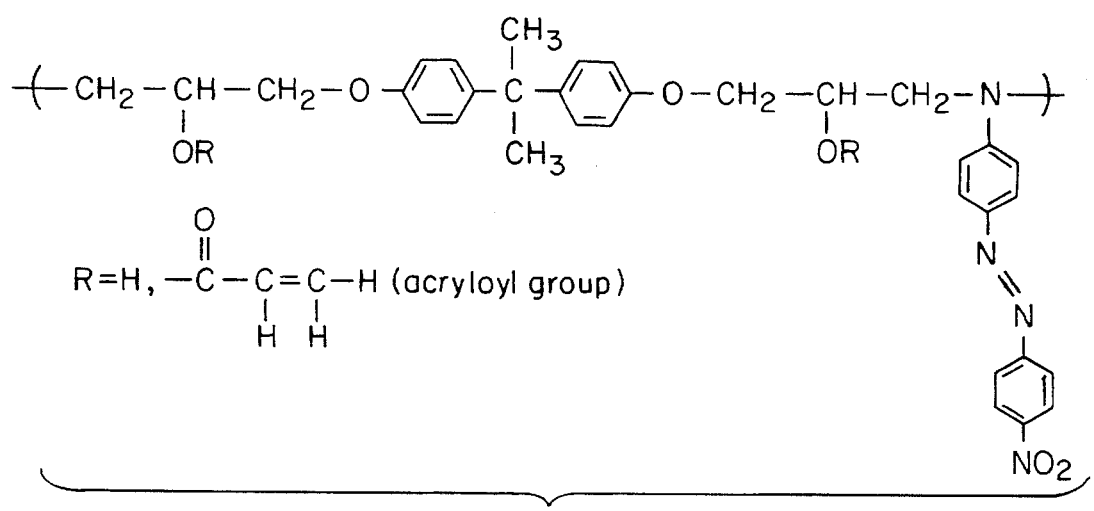
FIG. 2(a) BPAZO
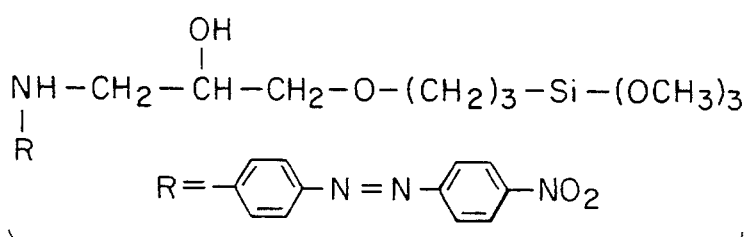
FIG. 2(b) ASD
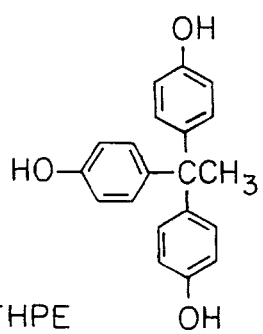
FIG. 2(c) THPE

SECOND ORDER NONLINEAR OPTICAL INTERPENETRATING POLYMER NETWORKS

GOVERNMENT FUNDING

This invention was made with support from the Government, Contract No. ONR 06-5485F, which has certain rights in the invention.

RELATED APPLICATIONS

This is the continuation application of U.S. Ser. No. 08/159,679, filed Nov. 30, 1993, now abandoned, which is a continuation-in-part of U.S. Ser. No. 07/881,609, filed May 12, 1992, now U.S. Pat. No. 5,290,824 which is a divisional of U.S. Ser. No. 07/573,253, filed Aug. 24, 1990 (now U.S. Pat. No. 5,112,881, issued May 12, 1992).

BACKGROUND OF THE INVENTION

Second order nonlinear optical (NLO) polymers are expected to find extensive uses in opto-electronic applications. NLO polymers have several advantages over single crystalline inorganic and organic molecular systems. These include easy preparation, adjustable refractive indices and controlled arrangement of spatial order. For second order applications it is imperative that the material by noncentrosymmetric. In noncentrosymmetric organizations several organic molecular and polymeric systems have been characterized by large second order NLO coefficients, ultra-fast response times, performance over a broad wavelength range and high laser damage threshold compared to the transitional inorganic materials, e.g., lithium niobate ($LiNbO_3$) or potassium dihydrogenphosphate ($KH_2PO_4$). Background information relating to the principles of nonlinear optical polymers, is contained in "Nonlinear Optical and Electroactive Polymers", edited by Prasad and Ulrich, Plenum Press, (1988).

A number of applications, such as second harmonic generation (SHG), frequency mixing, electro-optic modulation, optical parametric emission, amplification and oscillation have been proposed for organic and polymeric material with large second order NLO coefficients. R. D. Small et al., "Molecular and Polymeric Optoelectronic Materials: Fundamentals and Applications" edited by Khanarian, *SPIE*, 682:160 (1986). A number of approaches have been made in the past decade to organize NLO molecules in a polymer matrix in a noncentrosymmetric manner. The most important, but not the only aspect from the standpoint of application, is the organization of NLO molecules into preferred orientation and their stability in the aligned state up to at least cold wire bond temperatures (about 100° C.).

Historically, one of the first approaches to this alignment of NLO molecules in a polymeric system came with the concept of the "guest-host" system. Singer et al., *Appl. Phys. Lett.*, 49:248 (1986). The NLO molecules may be incorporated by a solution casting method with an amorphous polymer and the second order nonlinearity may be imparted by subsequent poling of the NLO molecules in the matrix using an external electric field, e.g., corona poling, parallel plate poling or integrated electrode poling. Advantages of this approach are ease of processing, tailorable refractive indices, control of spatial ordering of the polymer, and choice of a wide range of materials. However, the decay (both the initial and long term) of second order properties as confirmed through SHG from the matrix is unavoidable when the poling field is withdrawn from the matrix. Moreover, a high degree of loading of the NLO molecules in the polymer is not possible because of phase segregation of the matrix or blooming of NLO molecules in the matrix, both resulting in optical scattering.

In a second approach, known as "grafted" systems, a number of new features are routed just by linking NLO molecules covalently in the side chains of a suitable polymer backbone. Meredith et al., *Macromolecules*, 15:1385 (1982). Despite the synthetic complexity of such a system, a large number of NLO molecules (a concentration 2 to 3 times greater than the guest-host system) can be coupled with the polymer side chains, yet the polymers are easily processable. Both the initial and long term decay in second harmonic (SH) properties are reduced to a great extent.

Recently, a three dimensional network consisting of NLO molecules, known as the "cross-linked" system, has been developed to overcome a number of problems associated with the guest-host or grafted systems. Reck et al., *SPIE*, 1147:74 (1989) and Eich et al., *J. Appl. Phys.*, 66(7):3241 (1989). In this system, multifunctional epoxy and amino compounds containing NLO components are simultaneously processed, poled and crosslinked to freeze-in the nonlinear effects permanently. Properties resulting from the cross-linked system are significantly small decay in SH properties over a long period of time and the ability for processing with large concentrations of NLO molecules. However, for developing an optimal epoxy based NLO material precise control of the molecular weight of the prepolymer is a stringent and necessary condition. In addition, poling and curing at elevated temperatures has to be carried out over a long period of time (about 20 hours) making processing of the materials significantly difficult.

SUMMARY OF THE INVENTION

The invention relates to an interpenetrating polymer network which can exhibit nonlinear optical properties, and to a method of forming an interpenetrating polymer network which can exhibit nonlinear optical properties.

The interpenetrating polymer network composition includes a first polymer and a second polymer interpenetrating the first polymer. At least one of the polymers includes a nonlinear optical component.

The method includes combining a first pre-polymer, which can react to form a first polymer, with at least one monomer that can form a second polymer, wherein at least one of either the first prepolymer or the monomer includes a nonlinear optical component. The nonlinear optical component is poled. The first prepolymer and monomer are reacted while the nonlinear optical component is being poled, to cause the first prepolymer to form a first polymer network and to cause the monomer to form a second polymer network which interpenetrates the first polymer network, thereby forming a interpenetrating polymer network that can exhibit nonlinear optical properties.

The present invention has many advantages. For example, the interpenetrating polymer networks exhibit significantly improved stability over long periods of time and at relatively high temperatures. Further, the optical quality, before and after simultaneous poling and curing of the nonlinear optical component, is also significantly improved over known nonlinear optical compositions. Further, the interpenetrating polymer network compositions produced are easy to prepare and exhibit ultra-fast response times.

BRIEF DESCRIPTION OF HE DRAWINGS

FIG. 1 is a schematic representation of an interpenetrating polymer network, showing a first polymer and a second polymer interpenetrating the first polymer.

FIG. 2A is a schematic representation of one example of a suitable prepolymer, formed by a reaction of Biphenyl A and 4-(4'-nitrophenylazo)phenyl amine functionalize with crosslinkable acroloyl groups.

FIG. 2B is an example of a suitable monomer, an alkoxysilane dye of (3-glycidoxypropyl)trimethoxysilane, including 4(4'-nitrophenylazo)phenylamine as a nonlinear optical side group, for reaction to form a second polymer.

FIG. 2C is a schematic illustration of another suitable monomer, 1,1,1,-tris(4-hydroxyphenyl)ethane (THPE), for reaction to form a suitable second polymer.

DETAILED DESCRIPTION OF THE INVENTION

Figure 3:
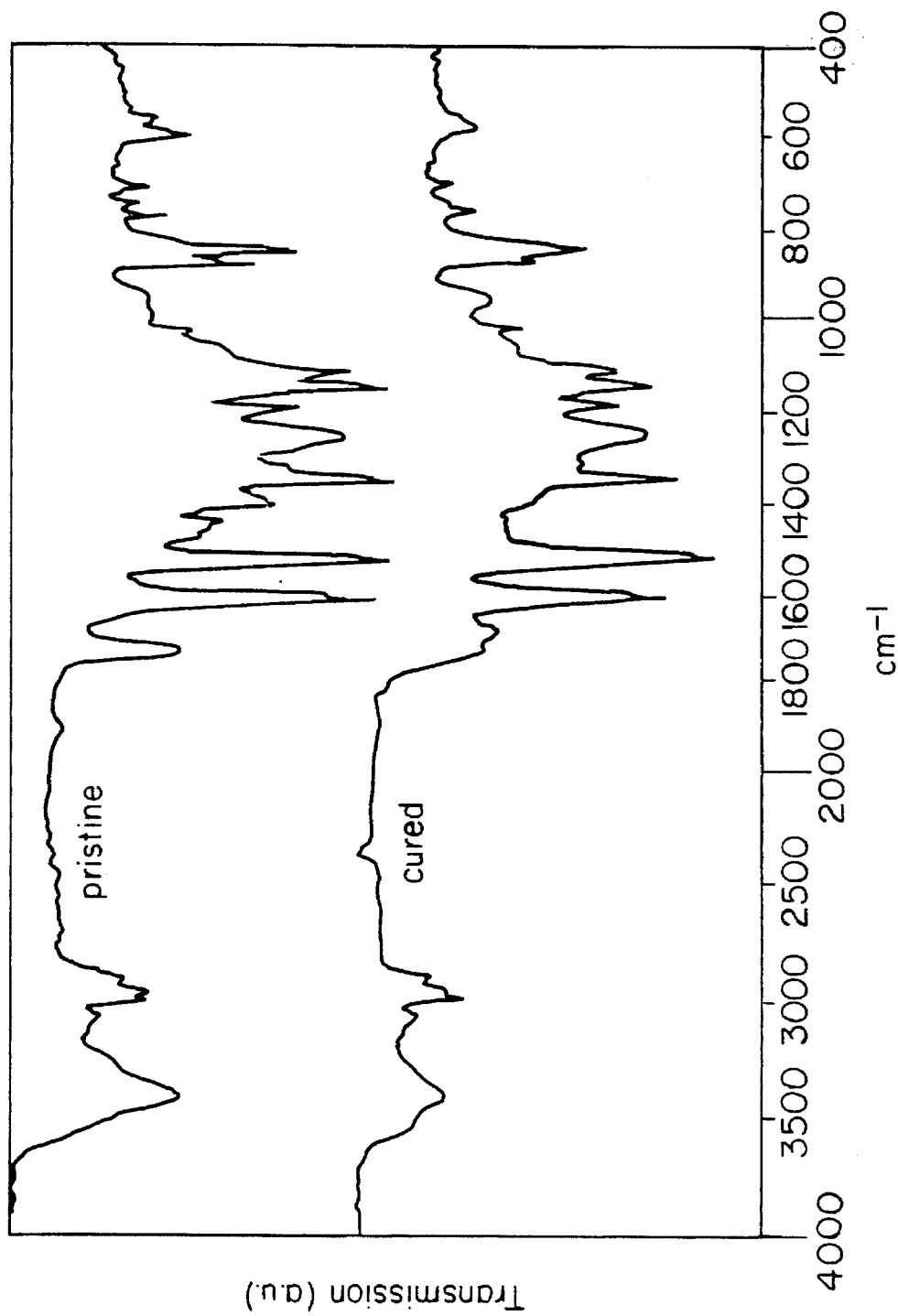
FIG. 3 is a plot of infrared spectra of a combined first prepolymer and monomers, and of an interpenetrating polymer network of the invention following polymerization of the combined first prepolymer and monomers.

The features and other details of the composition and method of forming the interpenetrating polymer network of the invention will now be more particularly described with reference to the accompanying figures and pointed out in the claims. It will be understood that the particular embodiments of the invention are shown by way of illustration and not as limitations of the invention. The principle functions of this invention can be employed in various embodiments without departing from the scope of the invention.

The present invention generally relates to interpenetrating polymer networks which can exhibit nonlinear optical activity. "Interpenetrating polymer network," as that phrase is employed herein, means a polymer composition which includes at least two distinct polymer chains. The composition includes, for example, a first polymer, and a second polymer which interpenetrates the first polymer. At least one of the two polymers includes a nonlinear optical component, whereby the interpenetrating polymer network composition can exhibit nonlinear optical properties. At least one of the polymers can be a crosslinked polymer.

FIG. 1 shows a schematic representation of an interpenetrating polymer network 10, which includes a first polymer 12 and a second polymer 14, which interpenetrates the first polymer. The first polymer and the second polymer are distinct, that is, they are not bonded to each other, such as are block polymer components of copolymers.

The method of forming the interpenetrating polymer network includes combining a first prepolymer, which can be polymerized to form the first polymer, and at least one monomer, which can be polymerized to form a second polymer that interpenetrates the first polymer. Suitable first prepolymers are those which, when combined with at least one suitable monomer, can react to form an interpenetrating polymer network with the polymerized monomer, and wherein, at least one of the polymers includes a nonlinear optical component that can be poled during formation of the first and second polymers to form a nonlinear optical interpenetrating polymer network. In one embodiment, the first prepolymer is an epoxy prepolymer.

An example of a suitable epoxy prepolymer is "BPAZO," which can be, for example, a diglycidyl ether of Bisphenol A functionalized with crosslinkable acryloyl groups. The first prepolymer can include a nonlinear optical component, such as 4-(4'-nitrophenylazo)phenylamine. An example of a suitable prepolymer for forming an epoxy-based network is the diglycidylether of Bisphenol A, and is shown in FIG. 2A. An example of a suitable method for forming this epoxy prepolymer is described in Jeng, R. J., et al., *Pure Applied Chemistry*, A29, 1115 (1992), and Jeng, R. J., et al., *Chem. Mater*, Vol. 4, No. 6 (1992), the teachings of which are incorporated herein by reference.

In one embodiment, at least two monomers are employed to form the second polymer. Preferably, the second polymer is a phenoxy-silicon polymer. An example of a suitable phenoxy-silicon polymer is a polymer formed from an alkoxysilane dye (ASD) and a suitable multi-functional phenoxy compound. An example of a suitable alkoxysilane dye is (glycidoxypropyl) trimethoxysilane. The alkoxysilane dye can include a nonlinear optical component, such as 4(4'-nitrophenylazo)phenylamine. A schematic representation of ASD, which includes 4(4'-nitrophenylazo) phenylamine as a nonlinear optical component, is shown in FIG. 2B. A suitable method by which an alkoxysilane dye can be formed is described in Jeng, R. J., et al., *Chem. Mater.*, 4, 1141 (1992), the teachings of which are incorporated herein by reference.

An example of a suitable phenoxy component of the phenoxy-silicon polymer is 1,1,1-tri(4-hydroxyphenyl) ethane (THPE). A schematic representation of this phenoxy component of the second polymer is shown in FIG. 2C.

In one embodiment, the silicon monomer component and the phenoxy monomer component are dissolved in a suitable solvent. An example of a suitable solvent is propylene glycol methyl ether acetate: 1,4-dioxane in a 3:1 volume-to-volume ratio. The solvent mixture can include a small amount of water and base catalyst. The ratio of the silicon component to the phenoxy component is a molar ratio of about 1.0:1.17. The complete details of an example of one method of forming a suitable monomer solution of the silicon monomer component and the phenoxy monomer component are disclosed in Jeng, R. J., et al. *Macromolecules*, Vol. 26:2530 (1993).

The first prepolymer is then dissolved in the solvent composition. Preferably, the weight ratio of the first prepolymer to the combined monomer components of the second polymer is about 1:1.

In a particularly preferred embodiment, the solution of the first prepolymer and the monomer components of the second polymer is spin-coated onto a suitable substrate, such as a glass substrate. The nonlinear optical component of the first and/or second monomer component(s) is/are poled by a suitable method to cause the nonlinear optical component to be substantially aligned. An example of a suitable method for poling the nonlinear optical component is corona poling. An example of a suitable corona poling technique is described in Mortazavi, M. A., et al., *J. Opt. Soc. Am. B*, 6:733 (1989), Ike et al., *J. Appl. Phys.*, 66:3241 (1989), and Jeng et al., *Optics Commun.*, 89:212 (1992), the teachings of all of which are incorporated herein by reference.

The composition is then exposed to conditions which cause the first prepolymer to polymerize and to cause the monomer components of the second polymer to polymerize. Application of the corona field is applied as the temperature of the prepolymerized solution is raised and while the prepolymer components polymerized to form the interpenetrating polymer network. Preferably, the current of the corona field is about 2 μA with a potential of about 4 kV. Also, preferably, the composition is raised to a temperature of about 200° C. for a period of time of about 60 minutes, to cause the prepolymer components of the first and second polymers to react and thereby form the interpenetrating polymer network. Formation of the first and second polymers is simultaneous.

Examples of other polymers which are suitable as either first or second polymers of the interpenetrating polymer network are disclosed in U.S. Ser. No. 07/881,609, filed May 12, 1992 and which is copending herewith, and in U.S. Ser. No. 07/573,252, filed Aug. 24, 1990, the teachings of both of which are incorporated herein by reference.

The invention will now be further and more specifically described in the following example. All parts and percentages are by weight unless otherwise specified.

Exemplification

To prepare a polymer solution for spin-coating, ASD and THPE with molar ratio of 1.0:1.17 were dissolved in a mixed solvent (propylene glycol methyl ether acetate: 1,4-dioxane=3:1(v/v)) with a small amount of water and base catalyst. BPAZO, which was dissolved in the same solvent, was subsequently added to this solution. The resulting solution contains a weight ratio of 1 to 1 for BPAZO to ASD/THPE. The solution was then spin-coated onto glass microscope slides to form optical quality thin films. The networks of BPAZO and ASD/THPE were formed simultaneously when the thin film was heated at 200° C. on a hot stage. The curing time was chosen to be 60 minutes to allow for sufficient crosslinking. The typical thickness of the cured films was approximately 0.6 μm. The reactions of both networks were monitored by FTIR (1760X, Perkin-Elmer). A differential scanning calorimeter (DSC 2910, T. A. Instrument Co.) was used to determine the glass temperature (Tg) of the samples. UV/Vis spectra were recorded on a Perkin Elmer Lambda-type 9 spectrophotometer. An ellipsometer (Rudolph research) was used to measure the refractive index. An SEM (IC-130, International Scientific Instruments) was employed to study the morphology of the interpenetrating polymer network (IPN) film which was coated with a thin layer of gold.

The corona poling technique was employed to align the nonlinear optical (NLO) chromophores. The corona field was applied as the temperature was raised to 80° C. The corona current was maintained at 2 μA with a potential of 4 kV and the poling temperature was maintained at 200° C. for 60 minutes. The sample was then cooled down slowly to room temperature while the corona field was kept on.

The second order NLO properties of the poled IPN samples were measured by second harmonic generation (SHG) from 1064 nm laser radiation. The relaxation behavior of the second order NLO properties was studied by monitoring the decay of the second harmonic (SH) intensity as a function of time at 110° C. and 160° C. immediately after poling and curing.

FIG. 3 shows the infrared (IR) spectra of both pristine and cured samples. The THPE/ASD network was formed through a sol-gel process. After the sample was heated at 200° C. for 60 minutes, the hydroxyl absorption peak (3387 $cm^{-1}$) and the $CH_3$ bending peaks (1423 and 1391 $cm^{-1}$) decreased significantly due to the reaction of THPE with ASD. In addition, a new peak was observed at 951 $cm^{-1}$ which confirmed the formation of phenoxysilicon bonds. The epoxy-based polymer network was formed through a free radical polymerization. The reaction of BPAZO resulted in a shift of the carbonyl absorption peak (1724 $cm^{-1}$) to higher wave numbers. The peak shift was due to the loss of conjugation by the reaction of the acryloyl group. In addition, an absorption peak was found at 1680 $cm^{-1}$ which may have been associated with intermolecular hydrogen bonding of the carbonyl group. The results from the IR spectra indicated that these two polymers each formed their own networks through different reaction mechanisms upon heating. However, the intensity of the absorption peaks from some functional groups such as nitro (1339, 1510 $cm^{-1}$), and phenyl (1602 $cm^{-1}$) were found to have slightly decreased. This indicated that some degree of thermal degradation occurred during curing.

Figure 4:
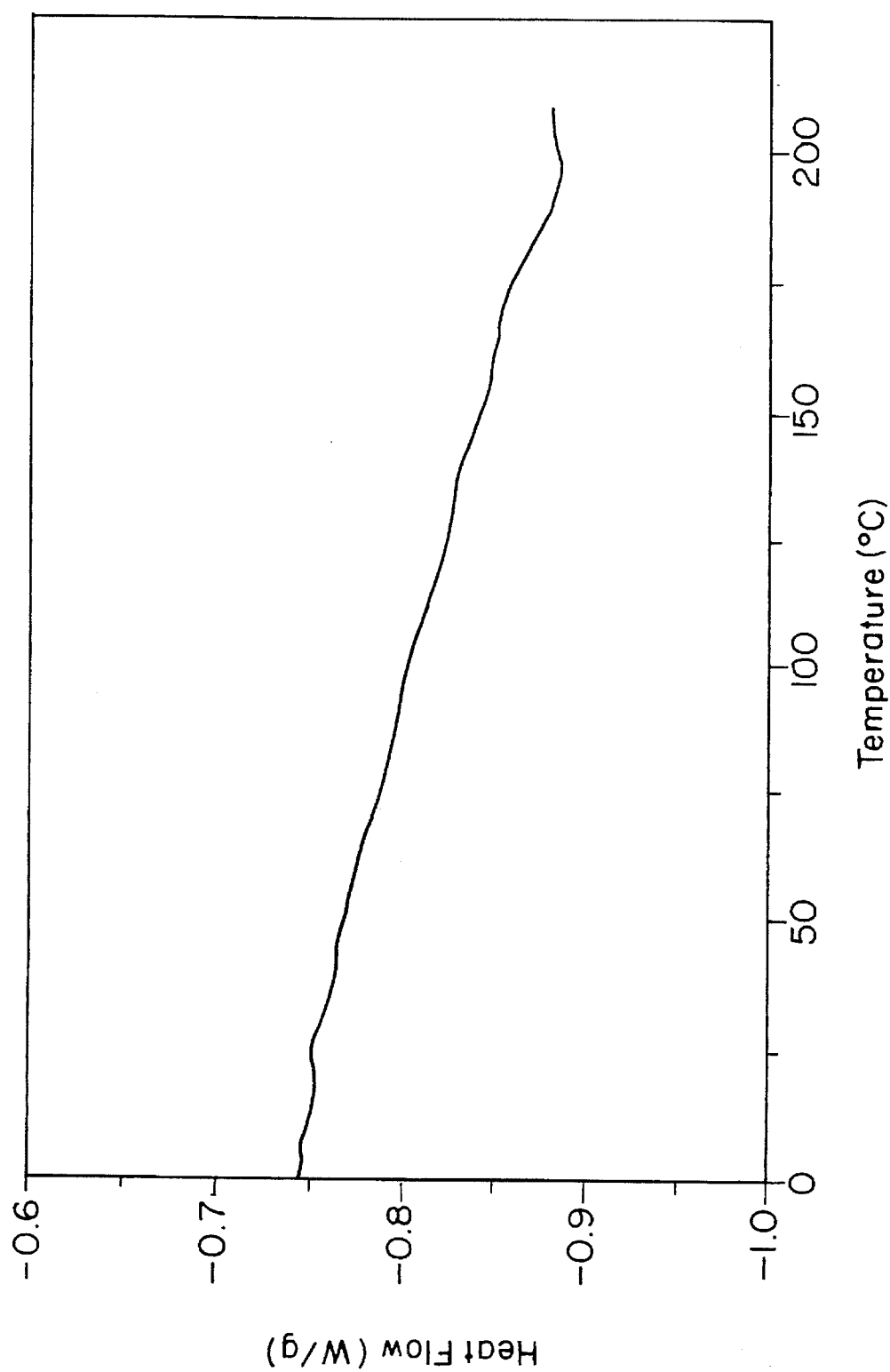
FIG. 4 is a plot of a thermogram of a nonlinear optical interpenetrating polymer network of the present invention.

The poled and cured IPN sample showed excellent optical quality. Its refractive indices at 532 and 1064 nm were determined to be 1.705 and 1.650 respectively. The homogeneity of this full IPN system was also suggested by the single Tg (176° C.) observed from the DSC thermogram with a 10° C./minute scanning rate (FIG. 4). The Tg of the cured phenoxy-silicon and BPAZO samples were determined to be 110 and 178° C. respectively. The fact that the Tg of the crosslinked phenoxy-silicon polymer did not manifest in the IPN sample implies that phase separation did not occur in this molecular composite. The homogeneity of this IPN was further confirmed using SEM. There was no sign of any phase separation even when the magnification was as high as 20K. Optical microscopy reveals a clear transparent featureless film as well.

Figure 5:
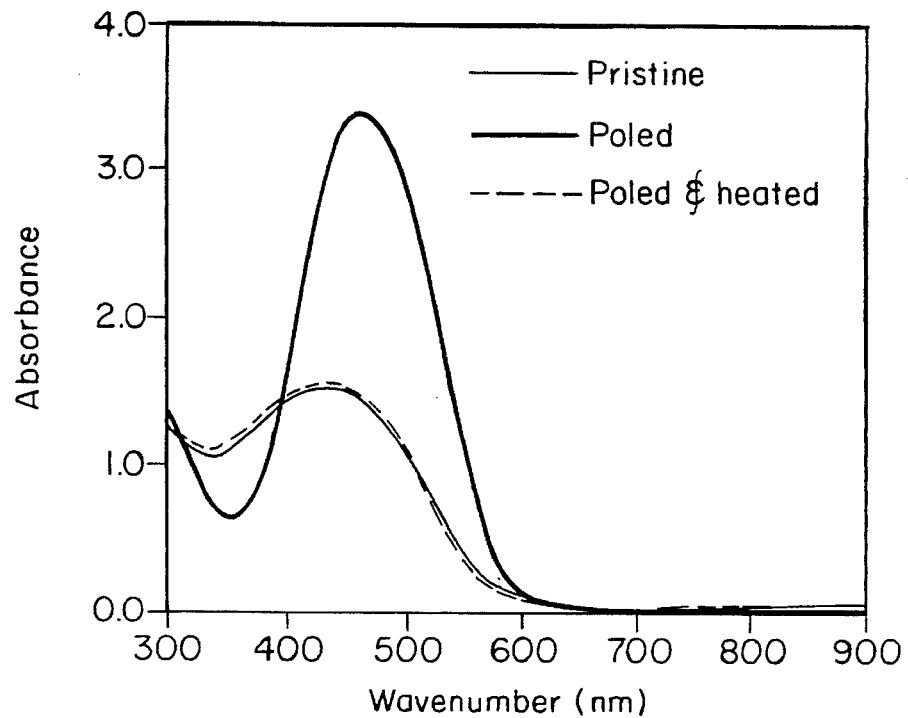
FIG. 5 is a plot of optical absorbance of a composition which includes the combined first prepolymer and ASD and THPE monomers, before and after poling the nonlinear optical components, and of the interpenetrating polymer network which includes the poled nonlinear optical component.

UV-Vis absorption spectra of the IPN is shown in FIG. 5. The pristine sample showed the absorption maximum of the disperse orange 3 at 458 nm. The absorption peak shifted to 436 nm and the absorbance reduced right after poling and curing. The reduction of the absorbance and the peak shifting confirmed the alignment of the chromophore as a result of poling. However, some reduction of the absorbance also resulted from some sublimation or degradation caused during the curing and poling process. After the same sample was heated at 110° C. for 168 hours, the absorption peak remained practically unchanged. This behavior implied that the chromophores did not degrade or sublime during this period of thermal treatment.

Figure 6:
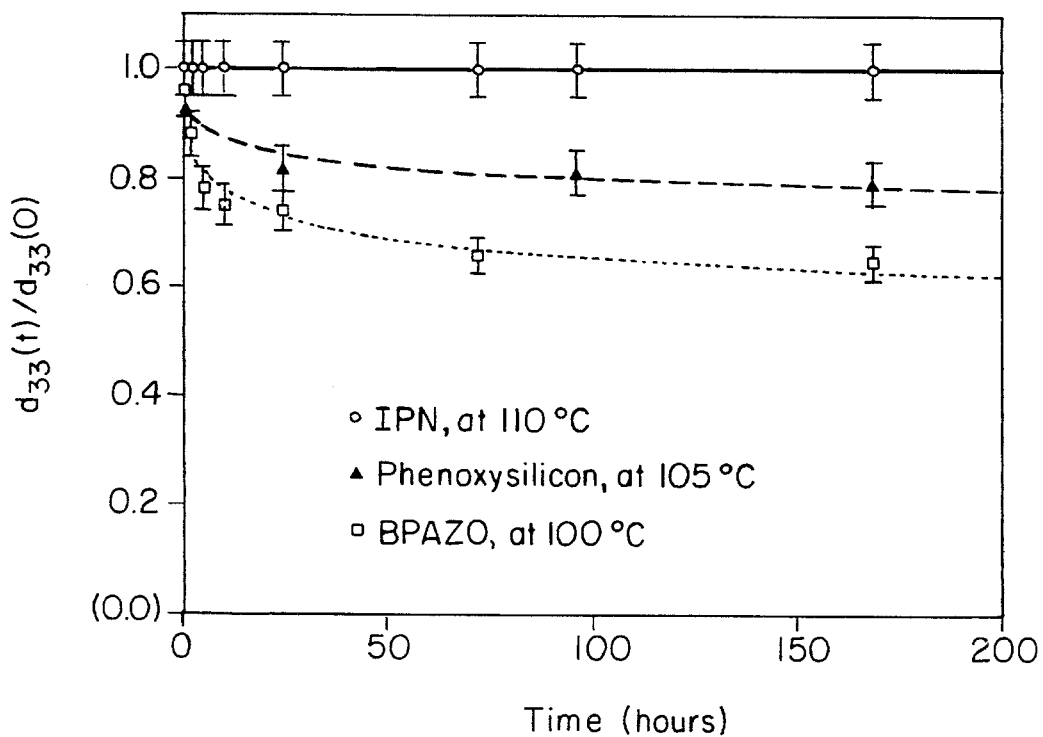
FIG. 6 is a plot of the second harmonic coefficient of prepolymers, and of a nonlinear optical interpenetrating polymer network of the present invention over time.

The temporal stability of second order nonlinearity of the poled/cured IPN, BPAZO, and phenoxy-silicon samples are shown in FIG. 6. The IPN system showed no measurable decay of SH intensity after being heated at 110° C. for 168 hours, whereas the BPAZO and the phenoxysilicon samples showed fast initial reduction of the SH intensity upon heating at 100 and 105° C. respectively. We infer from this result that the IPN possesses a much denser matrix than the single component ordinary network matrices. The NLO coefficient ($d_{33}$) of the poled IPN sample was measured to be 16 pm/V despite the occurrence of some thermal degradation during sample processing. After the film was heated on a hot stage at 160° C. for 15 hours, 50% retention of the $d_{33}$ value was still observed. This stability of SH intensity for the IPN system was a result of the high Tg of the polymers and the presence of a crosslinked network. In addition, permanent entanglements between the two networks further constrain the motion of aligned chromophores. Therefore, the mobility of the NLO chromophores was dramatically decreased which promoted the synergistic stability of the poled order. The excellent stability was ascribed to the novel interpenetrating crosslinked molecular structure of the IPN system.

In conclusion, a second order NLO material with superb stability based on an IPN was demonstrated. The poled polymer film exhibited a second order NLO coefficient $d_{33}$ of 16 pm/V. The poled sample showed no change in its SH intensity after being heated at 110° C. for as long as the stability was monitored (168 hours). Only 50% reduction of the $d_{33}$ was observed as the sample was heated at the temperature close to its Tg for 15 hours. The high rigidity of the polymer backbones and the interpenetrating structure of the polymer networks prevented the randomization of the aligned NLO chromophores.

Equivalents

Those skilled in the art will recognize, or be able to ascertain using no more than routine experimentation, many equivalents to the specific embodiments of the invention described herein. Such are intended to be encompassed by the following claims.

We claim:

1. An interpenetrating polymer network which can exhibit nonlinear optical properties, comprising:
    a) a first polymer; and
    b) a second polymer interpenetrating said first polymer, wherein at least one of said polymers includes a nonlinear optical component.

2. An interpenetrating polymer network of claim 1 wherein the first polymer and the second polymer both include a nonlinear optical component.

3. An interpenetrating polymer network of claim 2 wherein at least one of said first and second polymers is crosslinked.

4. An interpenetrating polymer network of claim 3 wherein both the first and second polymers are crosslinked.

5. An interpenetrating polymer network of claim 4 wherein the first polymer is an epoxy-based polymer.

6. An interpenetrating polymer network of claim 5 wherein the second polymer is a phenoxy-silicon-based polymer.

7. An interpenetrating polymer network of claim 6 wherein the first polymer includes a Bisphenol A component.

8. An interpenetrating polymer network of claim 7 wherein the nonlinear optical component further includes a nitrophenylazo phenylamine.

9. An interpenetrating polymer network of claim 8 wherein the nonlinear optical component includes 4-(4'-nitrophenylazo) phenylamine.

10. An interpenetrating polymer network of claim 9 wherein the epoxy-based polymer is crosslinked by an acryloyl group.

11. An interpenetrating polymer network of claim 10 wherein the phenoxy-silicon-based polymer includes an alkoxysilane dye component.

12. An interpenetrating polymer network of claim 11 wherein the alkoxyl silane dye component includes (3-glycidoxypropyl)trimethoxy silane.

13. An interpenetrating polymer network of claim 12 wherein the phenoxy-silicon-based polymer includes a multifunctional phenoxy component.

14. An interpenetrating polymer network of claim 13 wherein the multifunctional phenoxy component includes 1,1,1-tris(4-hydroxy phenyl)ethane.

15. A method of forming a composition which can exhibit nonlinear optional properties, comprising the steps of:
    a) combining a first prepolymer, which can react to form a first polymer, with at least one monomer that can form a second polymer, wherein at least one of either the first prepolymer or the monomer includes a nonlinear optical component;
    b) poling the nonlinear optical component; and
    c) reacting the first prepolymer and the monomer while the nonlinear optical component is being poled, to cause the first prepolymer to form a first polymer network and to cause the monomer to form a second polymer network which interpenetrates the first polymer network, thereby forming an interpenetrating polymer network that can exhibit nonlinear optical properties.

16. A method of claim 15 further including the step of forming the first prepolymer.

17. A method of claim 16 wherein the first prepolymer is formed by a method comprising the steps of:
    a) functionalizing a (nitrophenylazo)phenylamine with a crosslinkable functional group;
    b) combining the functionalized (nitrophenylazo) phenylamine with Bisphenol A; and
    c) reacting the combined functionalized (nitrophenylazo)phenylamine with the Bisphenol A to form said first prepolymer.

18. A method of claim 17 wherein the (nitrophenylazo) phenylamine includes 4-(4'-nitrophenylazo) phenylamine.

19. A method of claim 18 wherein the crosslinkable functional group includes an acryloyl group.

20. A method of claim 19 wherein the monomers include a silicon-based monomer and a phenoxy-based monomer.

21. A method of claim 20 wherein the silicon-based monomer is formed by a method, comprising the steps of:
    a) combining an alkoxysilane dye with a nonlinear optical compound; and
    b) reacting the nonlinear optical component with the alkoxysilane dye to form a nonlinear optical alkoxysilane dye.

22. A method of claim 21 wherein the alkoxysilane dye includes (3-glycidoxy propyl)trimethoxysilane.

23. A method of claim 22 wherein the nonlinear optical compound includes 4(4'-nitrophenylazo)phenylamine.

24. A method of claim 23 wherein the phenoxy-based monomer is a multifunctional phenoxy-based monomer.

25. A method of claim 24 wherein the multifunctional phenoxyl molecule includes 1,1,1-tris(4-hydroxyphenyl)ethane.

* * * * *